(12) United States Patent
Wang

(10) Patent No.: US 8,687,441 B2
(45) Date of Patent: Apr. 1, 2014

(54) METHOD FOR SEARCHING OPTIMUM VALUE OF MEMORY

(75) Inventor: Chih-Hsuan Wang, Tainan County (TW)

(73) Assignee: Himax Technologies Limited, Tainan (TW)

( * ) Notice: Subject to any disclaimer, the term of this patent is extended or adjusted under 35 U.S.C. 154(b) by 336 days.

(21) Appl. No.: 13/085,795

(22) Filed: Apr. 13, 2011

(65) Prior Publication Data

US 2012/0262997 A1 Oct. 18, 2012

(51) Int. Cl.
*G11C 7/00* (2006.01)

(52) U.S. Cl.
USPC .......................................... 365/194; 365/201

(58) Field of Classification Search
USPC ............ 365/193, 194, 201; 713/401; 711/167
See application file for complete search history.

(56) References Cited

U.S. PATENT DOCUMENTS

| | | | | |
|---|---|---|---|---|
| 5,060,239 A * | 10/1991 | Briscoe et al. | ................ | 375/260 |
| 6,889,334 B1 * | 5/2005 | Magro et al. | ................. | 713/500 |
| 7,107,424 B1 * | 9/2006 | Avakian et al. | ............... | 711/167 |
| 7,382,146 B2 * | 6/2008 | Negishi | .................... | 324/762.01 |
| 7,480,360 B2 * | 1/2009 | Querbach et al. | ............. | 375/356 |
| 2005/0286320 A1 * | 12/2005 | Iwasaki | .................... | 365/189.05 |
| 2006/0265161 A1 * | 11/2006 | Querbach et al. | ............... | 702/79 |
| 2008/0104351 A1 * | 5/2008 | VanZante et al. | ............. | 711/167 |

* cited by examiner

*Primary Examiner* — Douglas King

(74) *Attorney, Agent, or Firm* — J.C. Patents

(57) ABSTRACT

A method for searching an optimum value of a memory includes the following steps. A first and a second phase delay values of the memory are sequentially set to a plurality of first values and a plurality of second values respectively. amounts of combinations of the first values combining with the second values passing a reading and writing test is recorded. A portion of the first values that the amounts of the corresponding combinations passing the reading and writing test is greater than a threshold is selected. A first value near a median of the selected first values is selected as a first optimum value for setting the first phase delay value. A portion of second values passing the reading and writing test is recorded. A second value near a median of the recording second values is selected as a second optimum value for setting the second phase delay value.

12 Claims, 4 Drawing Sheets

METHOD FOR SEARCHING OPTIMUM VALUE OF MEMORY

BACKGROUND

1. Field of the Invention

The invention relates to a method for searching an optimum value. Particularly, the invention relates to a method for searching an optimum phase delay value of a memory.

2. Description of Related Art

In recent years, since a double data rate (DDR) synchronous dynamic random access memory (SDRM) has advantages of low power consumption, high durability, and high accessing speed, it is widely used in electronic products such as notebooks, workstations, servers, routers and switches.

In order to stably access the memory, an accessing method thereof is to suitably delay a data queue strobe (DQS) signal, and then latch a data queue (DQ) signal of the memory. Generally, a delay time of the DQS signal is determined by setting a phase delay value, and the delay time can be changed by changing the phase delay value. Moreover, the current delay time of the DQS signal is set according to a predetermined value, and the predetermined value is set according to a data sheet provided by a manufacturer. However, the phase delay value set according to the data sheet provided by the manufacturer cannot be adjusted along with factors such as an environment, a device state or a circuit layout, etc., so that the delay time of the DQS signal is probably not an optimum setting, and therefore an accessing state of the memory is unstable.

SUMMARY OF THE INVENTION

The invention is directed to a method for searching an optimum value of a memory, by which an optimum value of a phase delay value is searched, so as to avoid accessing failure of the memory due to a poor setting of the phase delay value.

The invention provides a method for searching an optimum value of a memory, which can be described as follows. A first phase delay value of the memory is sequentially set to a plurality of first values. A second phase delay value of the memory is sequentially set to a plurality of second values. A reading and writing test is performed to the memory. Amounts of combinations of each of the first values combining with the second values passing the reading and writing test is recorded. A portion of the first values that the amounts of the corresponding combinations passing the reading and writing test is greater than a first threshold is selected. A first value serving as a median or near the median of the selected first values is selected as a first optimum value. The first phase delay value is set to the first optimum value. A portion of the second values passing the reading and writing test is recorded. A second value serving as a median or near the median of the second values passing the reading and writing test is selected as a second optimum value. The second phase delay value is set to the second optimum value.

In an embodiment of the invention, the method for searching the optimum value of the memory further includes following steps. A third phase delay value of the memory is sequentially set to a plurality of third values. A fourth phase delay value of the memory is sequentially set to a plurality of fourth values. Amounts of combinations of each of the third values combining with the first values, the second values and the fourth values passing the reading and writing test is recorded. A portion of the third values that the amounts of the corresponding combinations passing the reading and writing test is greater than a second threshold is selected. A third value serving as a median or near the median of the selected third values is selected as a third optimum value. The third phase delay value is set to the third optimum value. Amounts of combinations of each of the fourth values combining with the first values and the second values passing the reading and writing test is recorded. A portion of the fourth values that the amounts of the corresponding combinations passing the reading and writing test is greater than a third threshold is selected. A fourth value serving as a median or near the median of the selected fourth values is selected as a fourth optimum value. The fourth phase delay value is set to the fourth optimum value.

In an embodiment of the invention, the first values, the second values, the third values and the fourth values are respectively a plurality of consecutive integers greater than or equal to 0.

In an embodiment of the invention, the first values, the second values, the third values and the fourth values are respectively a plurality of inconsecutive integers greater than or equal to 0.

In an embodiment of the invention, spaces between the first values, the second values, the third values and the fourth values are the same.

In an embodiment of the invention, the method for searching the optimum value of the memory further includes following steps. A plurality of consecutive fifth values is selected according to the first optimum value, where the fifth values include the first optimum value. A plurality of consecutive sixth values is selected according to the second optimum value, where the sixth values include the second optimum value. A plurality of consecutive seventh values is selected according to the third optimum value, where the seventh values include the third optimum value. A plurality of consecutive eighth values is selected according to the fourth optimum value, where the eighth values include the fourth optimum value. The first phase delay value is sequentially set to the fifth values; the second phase delay value is sequentially set to the sixth values, the third phase delay value is sequentially set to the seventh values, and the fourth phase delay value is sequentially set to the eighth values. Amounts of combinations of each of the seventh values combining with the fifth values, the sixth values and the eighth values passing the reading and writing test is recorded. A portion of the seventh values that the amounts of the corresponding combinations passing the reading and writing test is greater than a fourth threshold is selected. A seventh value serving as a median or near the median of the selected seventh values is selected as a fifth optimum value. The third phase delay value is set to the fifth optimum value. Amounts of combinations of each of the eighth values combining with the fifth values and the sixth values passing the reading and writing test is recorded. A portion of the eighth values that the amounts of the corresponding combinations passing the reading and writing test is greater than a fifth threshold is selected. An eighth value serving as a median or near the median of the selected eighth values is selected as a sixth optimum value. The fourth phase delay value is set to the sixth optimum value. Amounts of combinations of each of the fifth values combining with the sixth values passing the reading and writing test is recorded. A portion of the fifth values that the amounts of the corresponding combinations passing the reading and writing test is greater than a sixth threshold is selected. A fifth value serving as a median or near the median of the selected fifth values is selected as a seventh optimum value. The first phase delay value is set to the seventh optimum value. A portion of the sixth values passing the reading and writing test is recorded.

A sixth value serving as a median or near the median of the sixth values passing the reading and writing test is selected as an eighth optimum value. The second phase delay value is set to the eighth optimum value.

In an embodiment of the invention, the first optimum value is a median of the fifth values, the second optimum value is a median of the sixth values, the third optimum value is a median of the seventh values, and the fourth optimum value is a median of the eighth values.

In an embodiment of the invention, the first phase delay value, the second phase delay value, the third phase delay value and the fourth phase delay value are respectively a phase delay value corresponding to a data queue strobe (DQS) signal and a phase delay value corresponding to a data queue (DQ) signal during a data reading operation of the memory, and a phase delay value corresponding to the DQS signal and a phase delay value corresponding to the DQ signal during a data writing operation of the memory.

In an embodiment of the invention, the first values and the second values are respectively a plurality of consecutive integers greater than or equal to 0.

In an embodiment of the invention, the first values and the second values are respectively a plurality of inconsecutive integers greater than or equal to 0.

In an embodiment of the invention, spaces between the first values and the second values are the same.

In an embodiment of the invention, the method for searching the optimum value of the memory further includes following steps. A plurality of consecutive ninth values is selected according to the first optimum value, where the ninth values include the first optimum value. A plurality of consecutive tenth values is selected according to the second optimum value, where the tenth values include the second optimum value. The first phase delay value is sequentially set to the ninth values. The second phase delay value is sequentially set to the tenth values. Amounts of combinations of each of the ninth values combining with the tenth values passing the reading and writing test is recorded. A portion of the ninth values that the amounts of the corresponding combinations passing the reading and writing test is greater than a seventh threshold is selected. A ninth value serving as a median or near the median of the selected ninth values is selected as a ninth optimum value. The first phase delay value is set to the ninth optimum value. A portion of the tenth values passing the reading and writing test is recorded. A tenth value serving as a median or near the median of the tenth values passing the reading and writing test is selected as a tenth optimum value. The second phase delay value is set to the tenth optimum value.

In an embodiment of the invention, the first optimum value is a median of the ninth values, and the second optimal value is a median of the tenth values.

In an embodiment of the invention, the first phase delay value is one of a phase delay value corresponding to a DQS signal during a data reading operation of the memory and a phase delay value corresponding to the DQS signal during a data writing operation of the memory, and the second phase delay value is one of a phase delay value corresponding to a DQ signal during the data reading operation of the memory and a phase delay value corresponding to the DQ signal during the data writing operation of the memory.

According to the above descriptions, in the method for searching the optimum value of the memory of the invention, the first phase delay value is sequentially set to a plurality of first values, and the second phase delay value is sequentially set to a plurality of second values, so as to form a plurality of different combinations, and it is tested whether these combinations pass the reading and writing test, and then the first optimum value used for setting the first phase delay value is found according to the combinations passing the reading and writing test. When the first phase delay value is set to the first optimum value, the second phase delay value is sequentially set to the second values, and it is tested whether the second values pass the reading and writing test, and then the second optimum value used for setting the second phase delay value is accordingly found. In this way, the first phase delay value and the second phase delay value can be set to the first optimum value and the second optimum value passing the reading and writing test, so as to avoid accessing failure of the memory due to poor settings of the phase delay values.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a timing schematic diagram of a plurality of phase delay values sequentially set to different values according to an embodiment of the invention.

FIG. 2 is a schematic diagram illustrating phase delay values and numbers of combinations passing a reading and writing test according to an embodiment of the invention.

FIG. 3 is a timing schematic diagram of a plurality of phase delay values sequentially set to different values according to another embodiment of the invention.

FIG. 4 is a timing schematic diagram of phase delay values further set to different values according to another embodiment of the invention.

DETAILED DESCRIPTION OF DISCLOSED EMBODIMENTS

Figure 5:
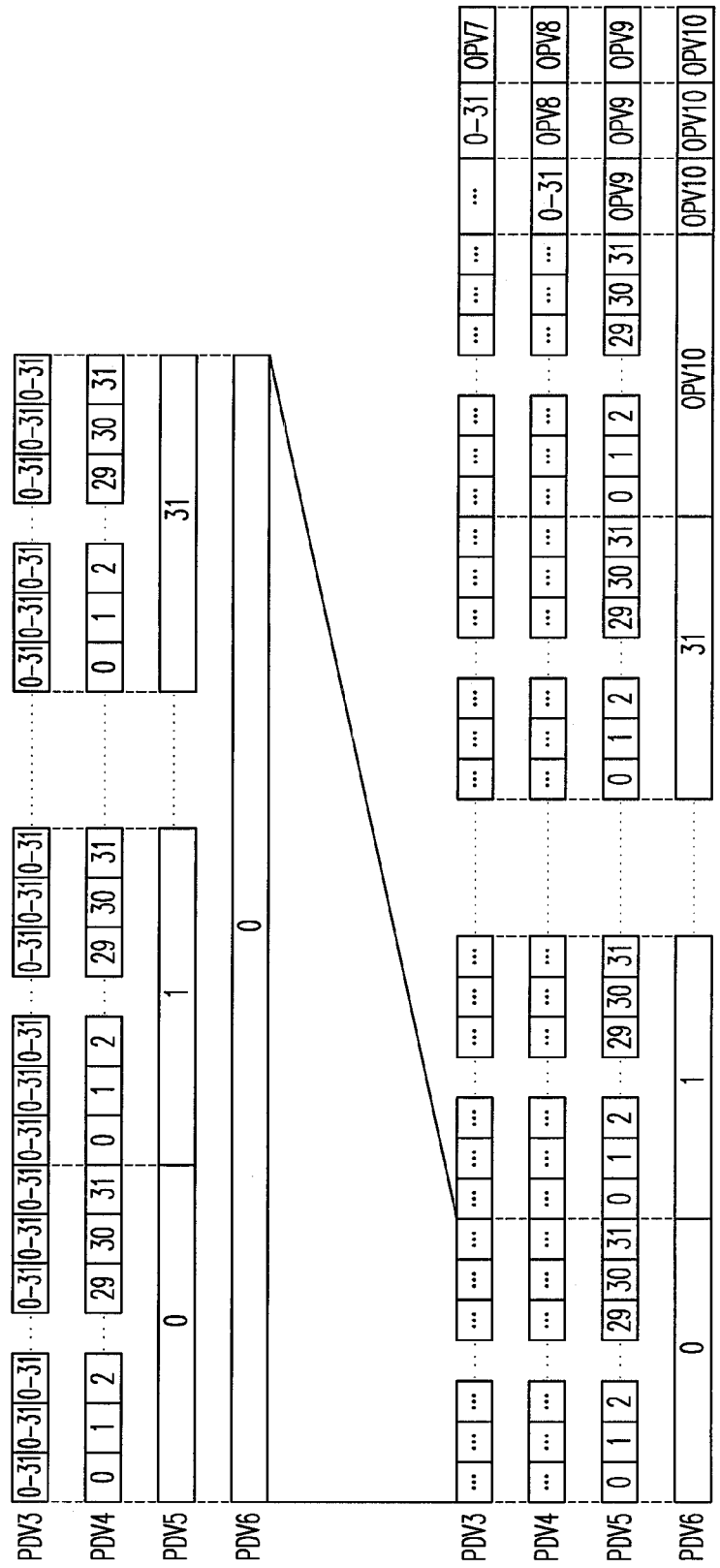
FIG. 5 is a timing schematic diagram of a plurality of phase delay values sequentially set to different values according to still another embodiment of the invention.

According to the description of the related art, since a phase delay value of a data queue strobe (DQS) signal is set according to a data sheet provided by a manufacturer, a delay time of the DQS signal cannot be adjusted along with factors such as an environment, a device state or a circuit layout, etc., which may lead to a result of data accessing failure. In order to resolve the above problem of data accessing failure, the invention provides a method for searching an optimum value of a memory, so as to search an optimum phase delay value. Moreover, the phase delay value is set as the delay time of the DQS signal, and comparatively, a delay time corresponding to a data queue (DQ) signal can also be set, i.e. a phase delay value corresponding to the DQ signal is set, so that the DQS signal and the DQ signal are matched in timing to achieve a data accessing function.

Moreover, a timing for a data reading operation and a timing for a data writing operation are probably different, so that suitable delay time of the DQS signal and the DQ signal during the data reading operation are probably different to suitable delay time of the DQS signal and the DQ signal during the data writing operation, i.e. during the data reading operation, the DQS signal and the DQ signal respectively correspond to two phase delay values, and during the data writing operation, the DQS signal and the DQ signal may respectively correspond to two other phase delay values.

Moreover, a value range of the phase delay value is determined according to a number of bits of the phase delay value. If the phase delay value has 5 bits, the value range of the phase delay value is 0 to 31 (i.e. the phase delay value has 32 gears), and if the phase delay value has 8 bits, the value range of the phase delay value is 0 to 255 (i.e. the phase delay value has 256 gears). Different gears correspond to different phase delay values, i.e. different gears correspond to different delay time.

Figures 1, 2, 3, 4:
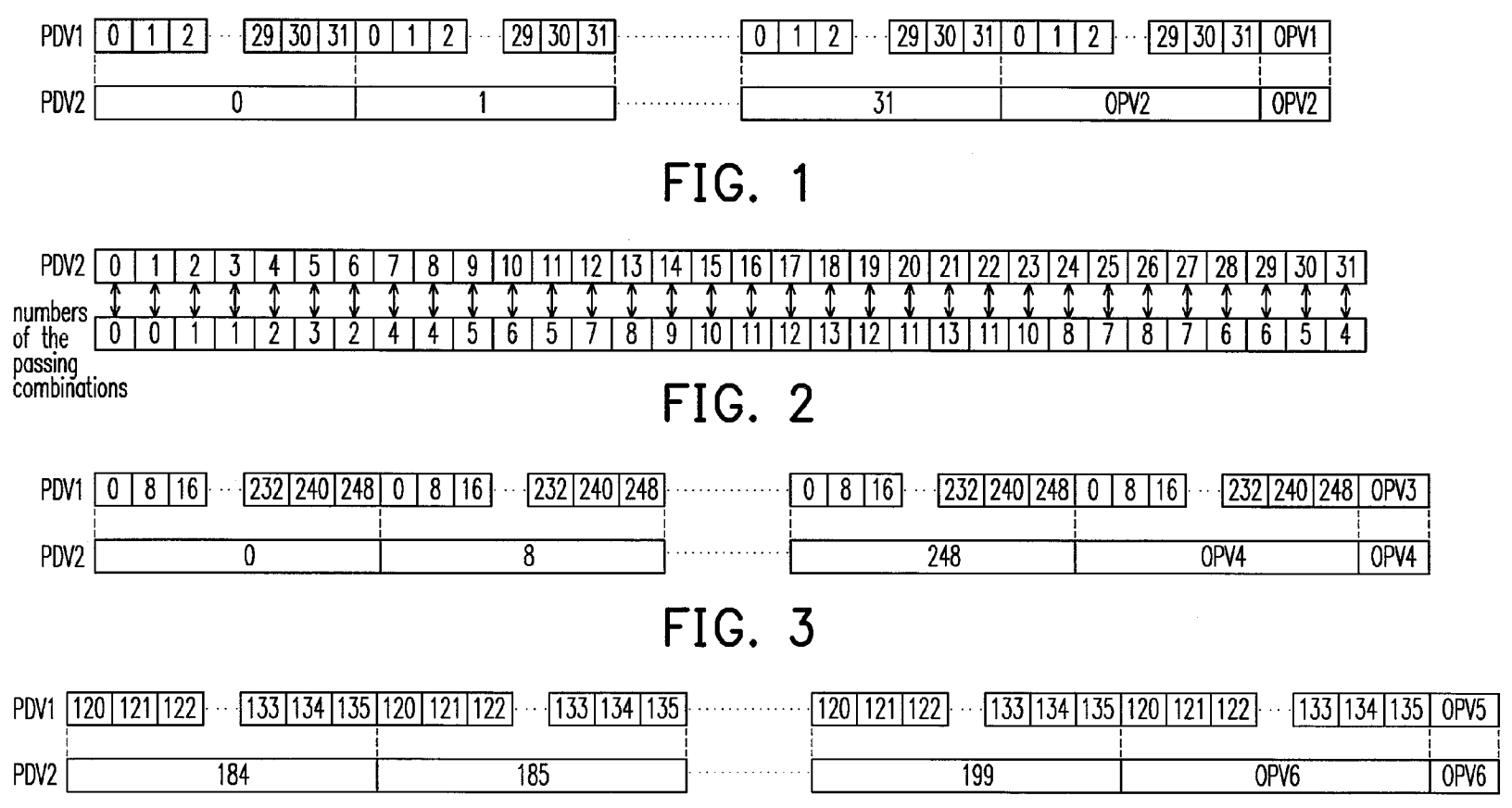

FIG. 1 is a timing schematic diagram of a plurality of phase delay values sequentially set to different values according to an embodiment of the invention. Referring to FIG. 1, in the present embodiment, a phase delay value PDV1 can be a phase delay value corresponding to one of the DQS signal and the DQ signal during the data writing operation of the memory, and a phase delay value PDV2 can be a phase delay value corresponding to one of the DQS signal and the DQ signal during the data reading operation of the memory.

Further, when the phase delay value PDV1 is the phase delay value corresponding to the DQS signal during the data writing operation of the memory, the phase delay value corresponding to the DQ signal during the data writing operation of the memory is set to a fixed value. When the phase delay value PDV1 is the phase delay value corresponding to the DQ signal during the data writing operation of the memory, the phase delay value corresponding to the DQS signal during the data writing operation of the memory is set to a fixed value. Similarly, when the phase delay value PDV2 is the phase delay value corresponding to the DQS signal during the data reading operation of the memory, the phase delay value corresponding to the DQ signal during the data reading operation of the memory is set to a fixed value. When the phase delay value PDV2 is the phase delay value corresponding to the DQ signal during the data reading operation of the memory, the phase delay value corresponding to the DQS signal during the data reading operation of the memory is set to a fixed value. The above fixed value can be a specific gear.

In other embodiments, the phase delay value PDV1 can be a phase delay value corresponding to one of the DQS signal and the DQ signal during the data reading operation of the memory, and the phase delay value PDV2 can be a phase delay value corresponding to one of the DQS signal and the DQ signal during the data writing operation of the memory, which can be determined by those skilled in the art.

In the present embodiment, assuming the phase delay values PDV1 and PDV2 are values of 5 bits, the value range of the phase delay values PDV1 and PDV2 are then 0 to 31. In the method for searching the optimum value of the memory of the present embodiment, the phase delay values PDV1 and PDV2 are sequentially set to 0 to 31, respectively. Moreover, during a period that the phase delay value PDV2 is set to 0, the phase delay value PDV1 is sequentially set to 0 to 31; during a period that the phase delay value PDV2 is set to 1, the phase delay value PDV1 is also sequentially set to 0 to 31, and the others are deduced by analogy. In other words, a value changing speed of the phase delay value PDV1 is relatively fast, and a value changing speed of the phase delay value PDV2 is relatively slow.

Each time when the value of the phase delay value PDV1 is changed, a reading and writing test is performed to the memory to test whether different value combinations of the phase delay values PDV1 and PDV2 can pass the reading and writing test. Moreover, amounts of combinations of the phase delay value PDV2 respectively set to 0 to 31 combining with the phase delay value PDV1 respectively set to 0 to 31 that pass the reading and writing test is recorded.

FIG. 2 is a schematic diagram illustrating the phase delay values and numbers of the combinations passing the reading and writing test according to an embodiment of the invention. Referring to FIG. 1 and FIG. 2, in the present embodiment, assuming when the phase delay value PDV2 is set to 0, an amount of the combinations passing the reading and writing test is 0; assuming when the phase delay value PDV2 is set to 1, an amount of the combinations passing the reading and writing test is 0; assuming when the phase delay value PDV2 is set to 2, an amount of the combinations passing the reading and writing test is 1, and the others are as that shown in FIG. 2, which are not repeated herein.

Then, the values that an amount of the corresponding combinations passing the reading and writing test is greater than a threshold TH1 are selected. The threshold TH1 is, for example, 9, so that the selected values are 15 to 23. Then, a value 19 serving as a median of the selected values (i.e. 15 to 23) is selected as an optimum value OPV2, where when the median of the selected values is not an integer, a value near the median (which is greater than or smaller than the median) can be selected, which is not limited by the invention.

After the optimum value OPV2 is searched, the phase delay value PDV2 is set to the optimum value OPV2 (for example, 19). During a period that the phase delay value PDV2 is set to 19, the phase delay value PDV1 is also sequentially set to 0 to 31. Each time after the value of the phase delay value PDV1 is changed, the reading and writing test is also performed to the memory. Moreover, a portion of the phase delay value PDV1 respectively set to 0 to 31 that pass the reading and writing test is recorded. For example, when the phase delay value PDV2 is set to 19, and the phase delay value PDV1 is set to 4 to 15, the memory can pass the reading and writing test. Therefore, a median of 4 to 15 is selected as an optimum value OPV1, and the phase delay value PDV1 is set to the optimum value OPV1, where since the median of 4 to 15 is not an integer, 9 or 10 can be selected to serve as the optimum value OPV1.

After the phased delay value PDV1 is set to the optimum value OPV1 and the phase delay value PDV2 is set to the optimum value OPV2, since the optimum values OPV1 and OPV2 are obtained through the reading and writing test, accessing failure due to poor settings of the phase delay values PDV1 and PDV2 can be avoided.

Moreover, in the method for searching the optimum value of the present embodiment, the phase delay values PDV1 and PDV2 are respectively set to a plurality of consecutive integers greater than or equal to 0. However, when the bit numbers of the phase delay values PDV1 and PDV2 are increased, time for executing the method for searching the optimum value of the present embodiment is also increased. Therefore, another embodiment of the invention provides another method for searching the optimum value, so as to reduce the time required for searching the optimum value.

FIG. 3 is a timing schematic diagram of a plurality of phase delay values sequentially set to different values according to another embodiment of the invention. Referring to FIG. 1 and FIG. 3, in the present embodiment, assuming the phase delay values PDV1 and PDV2 are values of 8 bits, the value range of the phase delay values PDV1 and PDV2 are then 0 to 255.

In the method for searching the optimum value of the memory of the present embodiment, the phase delay values PDV1 and PDV2 are not sequentially set to 0 to 255, but are sequentially set to values of 0, 8, 16, . . . , 248 progressively increased by 8. The phase delay values PDV1 and PDV2 are respectively set to 32 values from 0 to 255, though in other embodiments, 16 or 64 values can also be selectively set, and a value space is correspondingly adjusted to 16 or 4, which can be determined by those skilled in the art.

Each time when the value of the phase delay value PDV1 is changed, the reading and writing test is also performed to the memory to test whether different value combinations of the phase delay values PDV1 and PDV2 can pass the reading and writing test. Moreover, amounts of combinations of the phase delay value PDV2 respectively set to 0, 8, 16, . . . 248, etc. combining with the phase delay value PDV1 respectively set to 0, 8, 16, . . . 248, etc. that pass the reading and writing test is recorded, and then the values used for setting the phase delay value PDV2 are selected according to whether an amount of the corresponding combinations passing the reading and writing test is greater than a threshold TH2 (for example, 9).

Assuming the selected values are 160, 168, 176, 184, 192, 200, 208, 216 and 224, a median (i.e. 192) of the above selected values may serve as an optimum value OPV4. Then, the phase delay value PDV2 is set to 192 (i.e. the optimum value OPV4). During a period that the phase delay value PDV2 is set to 192, the phase delay value PDV1 is also sequentially set to 0, 8, 16, . . . , 248, etc. Each time after the value of the phase delay value PDV1 is changed, the reading and writing test is also performed to the memory. Moreover, a portion of the phase delay value PDV1 respectively set to 0, 8, 16, . . . , 248, etc. that pass the reading and writing test is recorded.

For example, when the phase delay value PDV2 is set to 192, and the phase delay value PDV1 is respectively set to 96, 104, 112, 120, 128, 136, 144, 152 and 160, the memory can pass the reading and writing test. Therefore, a median (i.e. 128) of 96, 104, 112, 120, 128, 136, 144, 152 and 160 is selected to serve as an optimum value OPV3, and the phase delay value PDV1 is set to the optimum value OPV3. When the median of the selected values is not a value used for setting the phase delay values PDV1 and PDV2 in the embodiment, a value near the median (which is greater than or smaller than the median) can be selected from values used for setting the phase delay values PDV1 and PDV2 in the embodiment.

According to the above descriptions, the method for searching the optimum values of the memory of the present embodiment is to perform a schematic search, and the searched optimum values OPV3 and OPV4 also have the effect of avoiding accessing failure of the memory due to poor settings of the phase delay values PDV1 and PDV2. Moreover, further searching can be performed according to the optimum values OPV3 and OPV4, so as to search fine optimum settings of the phase delay values PDV1 and PDV2.

FIG. 4 is a timing schematic diagram of the phase delay values further set to different values according to another embodiment of the invention. Referring to FIG. 3 and FIG. 4, in the present embodiment, the optimum values OPV3 and OPV4 are taken as reference values (for example, medians) to select a plurality of consecutive values to sequentially set the phase delay values PDV1 and PDV2. Assuming the optimum value OPV3 is 128, in the present embodiment, 128 is taken as a reference value to select total 16 values of anterior 8 values and posterior 7 values (i.e. from 120 to 135) for sequentially setting the phase delay value PDV1. Assuming the optimum value OPV4 is 192, in the present embodiment, 192 is taken as a reference value to select total 16 values of anterior 8 values and posterior 7 values (i.e. from 184 to 199) for sequentially setting the phase delay value PDV2. Where, a selecting range of the above values can be adjusted by those skilled in the art, and the same number of anterior values and posterior values can be selected to ensure the optimum values OPV3 and OPV4 to be medians of the selected values, though the invention is not limited thereto.

Then, the phase delay value PDV1 is sequentially set to 120 to 135, and the phase delay value PDV2 is sequentially set to 184 to 199. Each time when the value of the phase delay value PDV1 is changed, the reading and writing test is also performed to the memory. Moreover, amounts of combinations of the phase delay value PDV2 respectively set to 184 to 199 combining with the phase delay value PDV1 respectively set to 120 to 135 that pass the reading and writing test is recorded. Similarly, the values used for setting the phase delay value PDV2 are selected according to whether an amount of the corresponding combinations passing the reading and writing test is greater than a threshold TH3 (for example, 5).

Assuming the selected values are 188 to 194, a median (i.e. 191) of the above selected values may serve as an optimum value OPV6. Then, the phase delay value PDV2 is set to 191 (i.e. the optimum value OPV6). During a period that the phase delay value PDV2 is set to 191, the phase delay value PDV1 is also sequentially set to 120 to 135. Each time after the value of the phase delay value PDV1 is changed, the reading and writing test is also performed to the memory. Moreover, a portion of the phase delay value PDV1 respectively set to 120 to 135 that pass the reading and writing test is recorded.

For example, when the phase delay value PDV2 is set to 191, and the phase delay value PDV1 is respectively set to 122 to 128, the memory can pass the reading and writing test. Therefore, a median (i.e. 125) of 122 to 128 is selected to serve as an optimum value OPV5, and the phase delay value PDV1 is set to the optimum value OPV5.

FIG. 5 is a timing schematic diagram of a plurality of phase delay values sequentially set to different values according to still another embodiment of the invention. Referring to FIG. 1 and FIG. 5, in the above embodiment, the phase delay value corresponding to one of the DQS signal and the DQ signal during the data writing operation of the memory is searched, and the phase delay value corresponding to one of the DQS signal and the DQ signal during the data reading operation of the memory is searched. However, in the present embodiment, phase delay values corresponding to the DQS signal and the DQ signal during the data writing operation of the memory are searched, and phase delay values corresponding to the DQS signal and the DQ signal during the data reading operation of the memory are searched. In other words, phase delay values PDV3 to PDV6 are respectively phase delay values corresponding to the DQS signal and the DQ signal during the data writing operation, and phase delay values corresponding to the DQS signal and the DQ signal during the data reading operation.

In the present embodiment, the phase delay values PDV3 to PDV6 are, for example, values of 5 bits, so that the value range of the phase delay values PDV3 to PDV6 are 0 to 31. In the present embodiment, according to the method for searching the optimum value of the memory, the phase delay values PDV3 to PDV6 are sequentially set to 0 to 31.

Each time when the value of the phase delay value PDV3 is changed, the reading and writing test is performed to the memory to test whether different value combinations of the phase delay values PDV3 to PDV6 can pass the reading and writing test. Moreover, amounts of combinations of the phase delay value PDV6 respectively set to 0 to 31 combining with the phase delay value PDV5 respectively set to 0 to 31, the phase delay value PDV4 respectively set to 0 to 31 and the phase delay value PDV3 respectively set to 0 to 31 that pass the reading and writing test is recorded. Then, the values used for setting the phase delay value PDV6 are selected according to whether an amount of the corresponding combinations passing the reading and writing test is greater than a threshold TH4 (for example, 9216).

Assuming the selected values are 13 to 17, a median (i.e. 15) of the above selected values may serve as an optimum value OPV10. Then, the phase delay value PDV6 is set to 15 (i.e. the optimum value OPV10). During a period that the phase delay value PDV6 is set to 15 the phase delay values PDV3 to PDV5 are also sequentially set to 0 to 31. Each time after the value of the phase delay value PDV3 is changed, the reading and writing test is also performed to the memory. Moreover, amounts of combinations of the phase delay value PDV5 respectively set to 0 to 31 combining with the phase delay value PDV4 respectively set to 0 to 31 and the phase delay value PDV3 respectively set to 0 to 31 that pass the reading and writing test is recorded. Then, the values used for setting the phase delay value PDV5 are selected according to whether an amount of the corresponding combinations passing the reading and writing test is greater than a threshold TH5 (for example, 288).

Assuming the selected values are 16 to 22, a median (i.e. 19) of the above selected values may serve as an optimum value OPV9. Then, the phase delay value PDV5 is set to 19 (i.e. the optimum value OPV9). During a period that the phase delay value PDV6 is set to 15 and the phase delay value PDV5 is set to 19, the phase delay values PDV3 and PDV4 are sequentially set to 0 to 31. Each time after the value of the phase delay value PDV3 is changed, the reading and writing test is also performed to the memory. Moreover, amounts of combinations of the phase delay value PDV4 respectively set to 0 to 31 combining with the phase delay value PDV3 respectively set to 0 to 31 that pass the reading and writing test is recorded. Then, the values used for setting the phase delay value PDV4 are selected according to whether an amount of the corresponding combinations passing the reading and writing test is greater than a threshold TH6 (for example, 9).

Assuming the selected values are 14 to 18, a median (i.e. 16) of the above selected values may serve as an optimum value OPV8. Then, the phase delay value PDV4 is set to 16 (i.e. the optimum value OPV8). During a period that the phase delay value PDV6 is set to 15, the phase delay value PDV5 is set to 19 and the phase delay value PDV4 is set to 16, the phase delay value PDV3 is sequentially set to 0 to 31. Each time after the value of the phase delay value PDV3 is changed, the reading and writing test is also performed to the memory. Moreover, a portion of the phase delay value PDV3 respectively set to 0 to 31 that pass the reading and writing test is recorded.

For example, when the phase delay value PDV6 is set to 15, the phase delay value PDV5 is set to 19, the phase delay value PDV4 is set to 16 and the phase delay value PDV3 is respectively set to 10 to 17, the memory can pass the reading and writing test. Therefore, a median (i.e. 14) of 10 to 17 is taken as an optimum value OPV7, and the phase delay value PDV3 is set to the optimum value OPV7.

Figure 6:
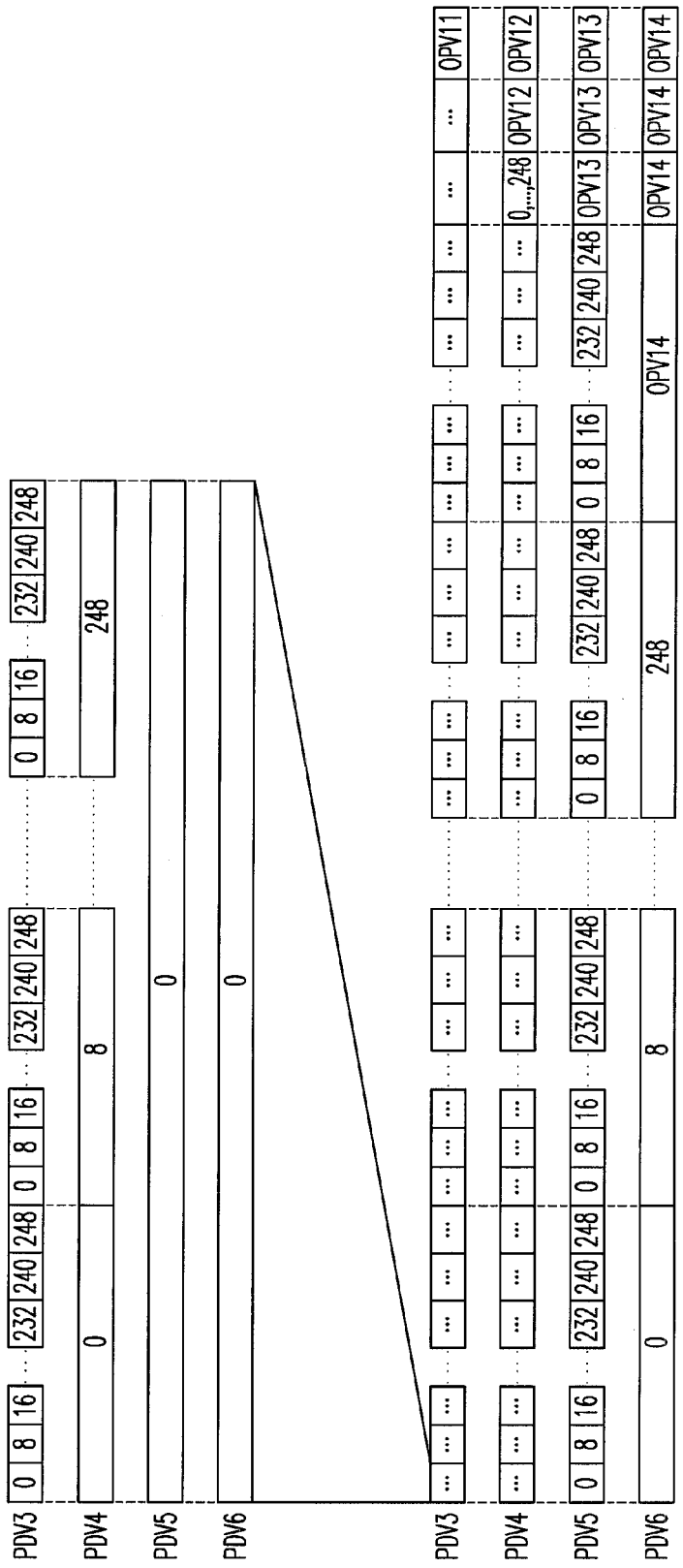
FIG. 6 is a timing schematic diagram of a plurality of phase delay values sequentially set to different values according to yet another embodiment of the invention.

FIG. 6 is a timing schematic diagram of a plurality of phase delay values sequentially set to different values according to yet another embodiment of the invention. Referring to FIG. 5 and FIG. 6, in the present embodiment, it is assumed that the phase delay values PDV3 to PDV6 are values of 8 bits, so that the value range of the phase delay values PDV3 to PDV6 are 0 to 255. In the present embodiment, according to the method for searching the optimum value of the memory, the phase delay values PDV3 to PDV6 are not sequentially set to 0 to 255, but are sequentially set to values of 0, 8, 16, 248, etc. progressively increased by 8.

Each time when the value of the phase delay value PDV3 is changed, the reading and writing test is also performed to the memory to test whether different value combinations of the phase delay values PDV3 to PDV6 can pass the reading and writing test. Moreover, amounts of combinations of the phase delay value PDV6 respectively set to 0, 8, 16, . . . 248, etc. combining with the phase delay value PDV5 respectively set to 0, 8, 16, . . . 248, etc., the phase delay value PDV4 respectively set to 0, 8, 16, . . . 248, etc. and the phase delay value PDV3 respectively set to 0, 8, 16, . . . 248, etc. that pass the reading and writing test is recorded. Then, the values used for setting the phase delay value PDV6 are selected according to whether an amount of the corresponding combinations passing the reading and writing test is greater than a threshold TH7 (for example, 9216).

Assuming the selected values are 96, 104, 112, 120, 128, 136, 144, 152 and 160, a median (i.e. 128) of the above selected values may serve as an optimum value OPV14. Then, the phase delay value PDV6 is set to 128 (i.e. the optimum value OPV14). During a period that the phase delay value PDV6 is set to 128, the phase delay values PDV3 to PDV5 are also sequentially set to 0, 8, 16, . . . , 248, etc. Each time after the value of the phase delay value PDV3 is changed, the reading and writing test is also performed to the memory. Then, the values used for setting the phase delay value PDV5 are selected according to whether an amount of the corresponding combinations passing the reading and writing test is greater than a threshold TH8 (for example, 288).

Assuming the selected values are 96, 104, 112, 120, 128, 136, 144, 152 and 160, a median (i.e. 128) of the above selected values may serve as an optimum value OPV13. Then, the phase delay value PDV5 is set to 128 (i.e. the optimum value OPV13). During a period that the phase delay value PDV6 is set to 128 and the phase delay value PDV5 is set to 128, the phase delay values PDV3 and PDV4 are also sequentially set to 0, 8, 16, . . . , 248, etc. Each time after the value of the phase delay value PDV3 is changed, the reading and writing test is also performed to the memory. Then, the values used for setting the phase delay value PDV4 are selected according to whether an amount of the corresponding combinations passing the reading and writing test is greater than a threshold TH9 (for example, 9).

Assuming the selected values are 160, 168, 176, 184, 192, 200, 208, 216 and 224, a median (i.e. 192) of the above selected values may serve as an optimum value OPV12. Then, the phase delay value PDV4 is set to 192 (i.e. the optimum value OPV12). During a period that the phase delay value PDV6 is set to 128, the phase delay value PDV5 is set to 128 and the phase delay value PDV4 is set to 192, the phase delay value PDV3 is also sequentially set to 0, 8, 16, . . . , 248, etc. Each time after the value of the phase delay value PDV3 is changed, the reading and writing test is also performed to the memory. Moreover, a portion of the phase delay value PDV3 respectively set to 0, 8, 16, . . . , 248, etc. that pass the reading and writing test is recorded.

For example, when the phase delay value PDV6 is set to 128, the phase delay value PDV5 is set to 128, the phase delay value PDV4 is set to 192 and the phase delay value PDV3 is respectively set to 96, 104, 112, 120, 128, 136, 144, 152 and 160, the memory can pass the reading and writing test. Therefore, a median (i.e. 128) of 96, 104, 112, 120, 128, 136, 144, 152 and 160 is taken as an optimum value OPV11, and the phase delay value PDV3 is set to the optimum value OPV11.

When the median of the selected values is not a value used for setting the phase delay values PDV3 to PDV6 in the embodiment, a value near the median (which is greater than or smaller than the median) can be selected from values used for setting the phase delay values PDV3 to PDV6 in the embodiment.

According to the above descriptions, the method for searching the optimum value of the memory of the present embodiment is to perform a schematic search, and the searched optimum values OPV11 to OPV14 also have the effect of avoiding accessing failure of the memory due to poor settings of the phase delay values PDV3 to PDV6. Moreover, further searching can be performed according to the optimum values OPV11 to OPV14, so as to search fine optimum settings of the phase delay values PDV3 to PDV6.

Figure 7:
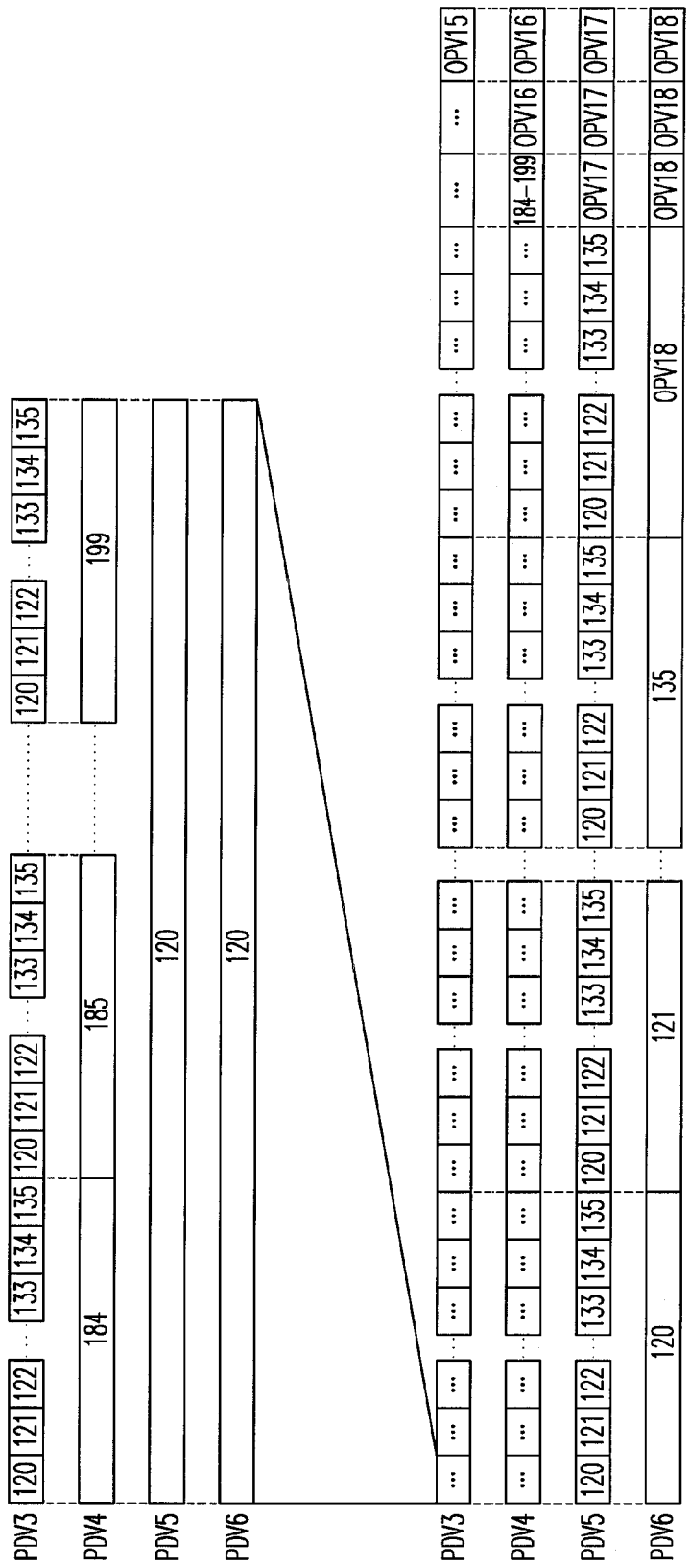
FIG. 7 is a timing schematic diagram of phase delay values further set to different values according to still another embodiment of the invention.

FIG. 7 is a timing schematic diagram of the phase delay values further set to different values according to still another embodiment of the invention. Referring to FIG. 6 and FIG. 7, in the present embodiment, the optimum values OPV15 to OPV18 are taken as reference values (for example, medians) to select a plurality of consecutive values to sequentially set the phase delay values PDV3 to PDV6. Assuming the optimum value OPV15 is 128, in the present embodiment, 128 is taken as a reference value to select total 16 values of anterior 8 values and posterior 7 values (i.e. from 120 to 135) for sequentially setting the phase delay value PDV3. Assuming the optimum value OPV16 is 192, in the present embodiment, 192 is taken as a reference value to select total 16 values of anterior 8 values and posterior 7 values (i.e. from 184 to 199) for sequentially setting the phase delay value PDV4. Assuming the optimum value OPV15 is 128, in the present embodiment, 128 is taken as a reference value to select total 16 values of anterior 8 values and posterior 7 values (i.e. from 120 to 135) for sequentially setting the phase delay value PDV5. Assuming the optimum value OPV15 is 128, in the present embodiment, 128 is taken as a reference value to select total 16 values of anterior 8 values and posterior 7 values (i.e. from 120 to 135) for sequentially setting the phase delay value PDV6.

Then, the phase delay value PDV3, PDV5 and PDV6 are sequentially set to 120 to 135, and the phase delay value PDV4 is sequentially set to 184 to 199. Each time when the value of the phase delay value PDV3 is changed, the reading and writing test is also performed to the memory. Moreover, amounts of combinations of the phase delay value PDV6 respectively set to 120 to 135 combining with the phase delay value PDV5 respectively set to 120 to 135, the phase delay value PDV4 respectively set to 184 to 199 and the phase delay value PDV3 respectively set to 120 to 135 that pass the reading and writing test is recorded. Similarly, the values used for setting the phase delay value PDV6 are selected according to whether an amount of the corresponding combinations passing the reading and writing test is greater than a threshold TH10 (for example, 5).

Assuming the selected values are 124 to 130, a median (i.e. 127) of the above selected values may serve as an optimum value OPV18. Then, the phase delay value PDV6 is set to 127 (i.e. the optimum value OPV18). During a period that the phase delay value PDV6 is set to 127, the phase delay values PDV3 and PDV5 are also sequentially set to 120 to 135, and the phase delay value PDV4 is also sequentially set to 184 to 199. Each time after the value of the phase delay value PDV3 is changed, the reading and writing test is also performed to the memory. Moreover, amounts of combinations of the phase delay value PDV5 respectively set to 120 to 135 combining with the phase delay value PDV4 respectively set to 184 to 199 and the phase delay value PDV3 respectively set to 120 to 135 that pass the reading and writing test is recorded. Similarly, the values used for setting the phase delay value PDV5 are selected according to whether an amount of the corresponding combinations passing the reading and writing test is greater than a threshold TH11 (for example, 5).

Assuming the selected values are 126 to 132, a median (i.e. 129) of the above selected values may serve as an optimum value OPV17. Then, the phase delay value PDV5 is set to 129 (i.e. the optimum value OPV17). During a period that the phase delay value PDV6 is set to 127 and the phase delay value PDV5 is set to 129, the phase delay value PDV3 is also sequentially set to 120 to 135, and the phase delay value PDV4 is also sequentially set to 184 to 199. Each time after the value of the phase delay value PDV3 is changed, the reading and writing test is also performed to the memory. Moreover, amounts of combinations of the phase delay value PDV4 respectively set to 184 to 199 combining with the phase delay value PDV3 respectively set to 120 to 135 that pass the reading and writing test is recorded. Similarly, the values used for setting the phase delay value PDV4 are selected according to whether an amount of the corresponding combinations passing the reading and writing test is greater than a threshold TH12 (for example, 5).

Assuming the selected values are 189 to 195, a median (i.e. 192) of the above selected values may serve as an optimum value OPV16. Then, the phase delay value PDV4 is set to 192 (i.e. the optimum value OPV16). During a period that the phase delay value PDV6 is set to 127, the phase delay value PDV5 is set to 129 and the phase delay value PDV4 is set to 192, the phase delay value PDV3 is also sequentially set to 120 to 135. Each time after the value of the phase delay value PDV3 is changed, the reading and writing test is also performed to the memory. Moreover, a portion of the phase delay value PDV3 respectively set to 120 to 135 that pass the reading and writing test is recorded.

For example, when the phase delay value PDV6 is set to 127, the phase delay value PDV5 is set to 129, the phase delay value PDV4 is set to 192 and the phase delay value PDV3 is respectively set to 122 to 128, the memory can pass the reading and writing test. Therefore, a median (i.e. 125) of 122 to 128 is taken as an optimum value OPV15, and the phase delay value PDV3 is set to the optimum value OPV15.

In summary, in the method for searching the optimum value of the memory, the phase delay values are sequentially set to a plurality of values to form different combinations, and it is tested whether these combinations pass the reading and writing test, and then the optimum values are found according to the combinations passing the reading and writing test. In this way, the phase delay values can be set to the optimum values passing the read and writing test, so as to avoid accessing failure of the memory due to poor settings of the phase delay values. Moreover, the phase delay values can be sequentially set to a plurality of inconsecutive values to find schematic optimum values, and then a plurality of consecutive values is selected according to the schematic optimum values to set the phase delay values, so as to find the fine optimum values. In this way, a searching time is shortened according to such two-stage searching method.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for searching an optimum value of a memory, applied to a memory controller, comprising:

sequentially setting a first phase delay value of the memory to a plurality of first values;

sequentially setting a second phase delay value of the memory to a plurality of second values, wherein the first values and the second values are respectively a plurality of inconsecutive integers greater than or equal to 0;

performing a reading and writing test to the memory;

recording a number of combinations of each of the first values and the second values passing the reading and writing test;

selecting a portion of the first values that the number of the corresponding combinations passing the reading and writing test is greater than a first threshold;

selecting one of the first values that is a median of the portion of the first values or near the median of the portion of the first values as a first optimum value;

setting the first phase delay value to the first optimum value;

recording a portion of the second values passing the reading and writing test;

selecting one of the second values that is a median of the portion of the second values or near the median of the portion of the second values passing the reading and writing test as a second optimum value; and setting the second phase delay value to the second optimum value.

2. The method for searching the optimum value of the memory as claimed in claim 1, further comprising:

sequentially setting a third phase delay value of the memory to a plurality of third values;

sequentially setting a fourth phase delay value of the memory to a plurality of fourth values;

recording a number of combinations of each of the third values, the first values, the second values and the fourth values passing the reading and writing test;

selecting a portion of the third values that the number of the corresponding combinations passing the reading and writing test is greater than a second threshold;

selecting one of the third values that is a median of the portion of the third values or near the median of the the portion of the third values as a third optimum value;

setting the third phase delay value to the third optimum value;

recording a number of combinations of each of the fourth values, the first values and the second values passing the reading and writing test;

selecting a portion of the fourth values that the number of the corresponding combinations passing the reading and writing test is greater than a third threshold;

selecting one of the fourth values that is a median of the portion of the fourth value or near the median of the portion of fourth values as a fourth optimum value; and setting the fourth phase delay value to the fourth optimum value.

3. The method for searching the optimum value of the memory as claimed in claim 2, wherein the third values and the fourth values are respectively a plurality of consecutive integers greater than or equal to 0.

4. The method for searching the optimum value of the memory as claimed in claim 2, wherein the third values and the fourth values are respectively a plurality of inconsecutive integers greater than or equal to 0.

5. The method for searching the optimum value of the memory as claimed in claim 4, wherein intervals between the first values, the second values, the third values and the fourth values are the same.

6. The method for searching the optimum value of the memory as claimed in claim 4, further comprising:

selecting a plurality of consecutive fifth values according to the first optimum value, wherein the fifth values comprise the first optimum value;

selecting a plurality of consecutive sixth values according to the second optimum value, wherein the sixth values comprise the second optimum value;

selecting a plurality of consecutive seventh values according to the third optimum value, wherein the seventh values comprise the third optimum value;

selecting a plurality of consecutive eighth values according to the fourth optimum value, wherein the eighth values comprise the fourth optimum value;

sequentially setting the first phase delay value to the fifth values;

sequentially setting the second phase delay value to the sixth values;

sequentially setting the third phase delay value to the seventh values;

sequentially setting the fourth phase delay value to the eighth values;

recording a number of combinations of each of the seventh values, the fifth values, the sixth values and the eighth values passing the reading and writing test;

selecting a portion of the seventh values that the number of the corresponding combinations passing the reading and writing test is greater than a fourth threshold;

selecting a seventh value serving as a median or near the median of the selected seventh values as a fifth optimum value;

setting the third phase delay value is set to the fifth optimum value;

recording a number of combinations of each of the eighth values, the fifth values and the sixth values passing the reading and writing test;

selecting a portion of the eighth values that the a number of the corresponding combinations passing the reading and writing test is greater than a fifth threshold;

selecting one of the eighth values that is a median of the portion of the eighth values or near the median of the portion of the eighth values as a sixth optimum value;

setting the fourth phase delay value to the sixth optimum value;

recording a number of combinations of each of the fifth values and the sixth values passing the reading and writing test;

selecting a portion of the fifth values that the number of the corresponding combinations passing the reading and writing test is greater than a sixth threshold;

selecting one of the fifth values that is a median of the portion of the fifth values or near the median of the portion of the fifth values as a seventh optimum value;

setting the first phase delay value to the seventh optimum value;

recording a portion of the sixth values passing the reading and writing test;

selecting one of the sixth values that is a median of the portion of the sixth values or near the median of the portion of the sixth values passing the reading and writing test as an eighth optimum value; and setting the second phase delay value to the eighth optimum value.

7. The method for searching the optimum value of the memory as claimed in claim 6, wherein the first optimum value is a median of the fifth values, the second optimum value is a median of the sixth values, the third optimum value is a median of the seventh values, and the first optimum value is a median of the fifth values.

8. The method for searching the optimum value of the memory as claimed in claim 2, wherein the first phase delay value, the second phase delay value, the third phase delay value and the fourth phase delay value are respectively a phase delay value corresponding to a data queue strobe (DQS) signal and a phase delay value corresponding to a data queue (DQ) signal during a data reading operation of the memory, and a phase delay value corresponding to the DQS signal and a phase delay value corresponding to the DQ signal during a data writing operation of the memory.

9. The method for searching the optimum value of the memory as claimed in claim 1, wherein interval s between the first values and the second values are the same.

10. The method for searching the optimum value of the memory as claimed in claim 1, further comprising:
   selecting a plurality of consecutive ninth values according to the first optimum value, wherein the ninth values comprise the first optimum value;
   selecting a plurality of consecutive tenth values according to the second optimum value, wherein the tenth values comprise the second optimum value;
   sequentially setting the first phase delay value to the ninth values;
   sequentially setting the second phase delay value to the tenth values;
   recording a number of combinations of each of the ninth values and the tenth values passing the reading and writing test;
   selecting a portion of the ninth values that the a number of the corresponding combinations passing the reading and writing test is greater than a seventh threshold;
   selecting one of the ninth values that is a median of the portion of the ninth values or near the median of the portion of the ninth values as a ninth optimum value;
   setting the first phase delay value to the ninth optimum value;
   recording a portion of the tenth values passing the reading and writing test;
   selecting one of the tenth value that is a median of the portion of the tenth value or near the median of the portion of the tenth values passing the reading and writing test as a tenth optimum value; and
   setting the second phase delay value to the tenth optimum value.

11. The method for searching the optimum value of the memory as claimed in claim 10, wherein the first optimum value is a median of the ninth values, and the second optimal value is a median of the tenth values.

12. The method for searching the optimum value of the memory as claimed in claim 1, wherein the first phase delay value is one of a phase delay value corresponding to a DQS signal during a data reading operation of the memory and a phase delay value corresponding to the DQS signal during a data writing operation of the memory, and the second phase delay value is one of a phase delay value corresponding to a DQ signal during the data reading operation of the memory and a phase delay value corresponding to the DQ signal during the data writing operation of the memory.

* * * * *